United States Patent
Li

(10) Patent No.: US 8,173,528 B2
(45) Date of Patent: May 8, 2012

(54) GALLIUM-DOPED MONOCRYSTALLINE SILICON SOLAR CELL AND MANUFACTURE METHOD FOR THE SAME

(75) Inventor: Jian Li, Jiangsu (CN)

(73) Assignee: Wuxi Suntech Power Co., Ltd., Jiangsu (CN)

( * ) Notice: Subject to any disclaimer, the term of this patent is extended or adjusted under 35 U.S.C. 154(b) by 240 days.

(21) Appl. No.: 12/605,449

(22) Filed: Oct. 26, 2009

(65) Prior Publication Data

US 2010/0108139 A1   May 6, 2010

(30) Foreign Application Priority Data

Oct. 24, 2008   (CN) .......................... 2008 1 0171923

(51) Int. Cl.
*H01L 21/22* (2006.01)
(52) U.S. Cl. .................. 438/550; 438/98; 257/E21.211; 257/E31.11
(58) Field of Classification Search .................. 438/550, 438/98; 257/E21.211, E31.11
See application file for complete search history.

(56) References Cited

FOREIGN PATENT DOCUMENTS

| CN | 1719621 A | 1/2006 |
|---|---|---|
| CN | 1808727 A | 7/2006 |

OTHER PUBLICATIONS

Chinese Office Action for related CN Application No. 200810171923.8, dated Aug. 21, 2009; English translation provided.

*Primary Examiner* — Bradley K Smith
*Assistant Examiner* — Amar Movva
(74) *Attorney, Agent, or Firm* — Baker & Hostetler LLP

(57) ABSTRACT

A manufacture method for a gallium-doped monocrystalline silicon solar cell is provided. The method includes classifying the sheets of gallium-doped monocrystalline silicon according to resistivity; texturing and washing the sheets of gallium-doped monocrystalline silicon; diffusing the classified, textured and washed sheets of gallium-doped monocrystalline silicon; etching and depositing the sheets of gallium-doped monocrystalline silicon; and metalizing the sheets of gallium-doped monocrystalline silicon. Advantageously, Light Induced Degradation (LID) is efficiently, economically and conveniently suppressed, the light induced efficiency degradation of monocrystalline silicon solar cell can be controlled within 1%, and meanwhile, the effect of the uneven resistivity distribution of gallium-doped monocrystalline on the cell process is reduced.

4 Claims, 1 Drawing Sheet

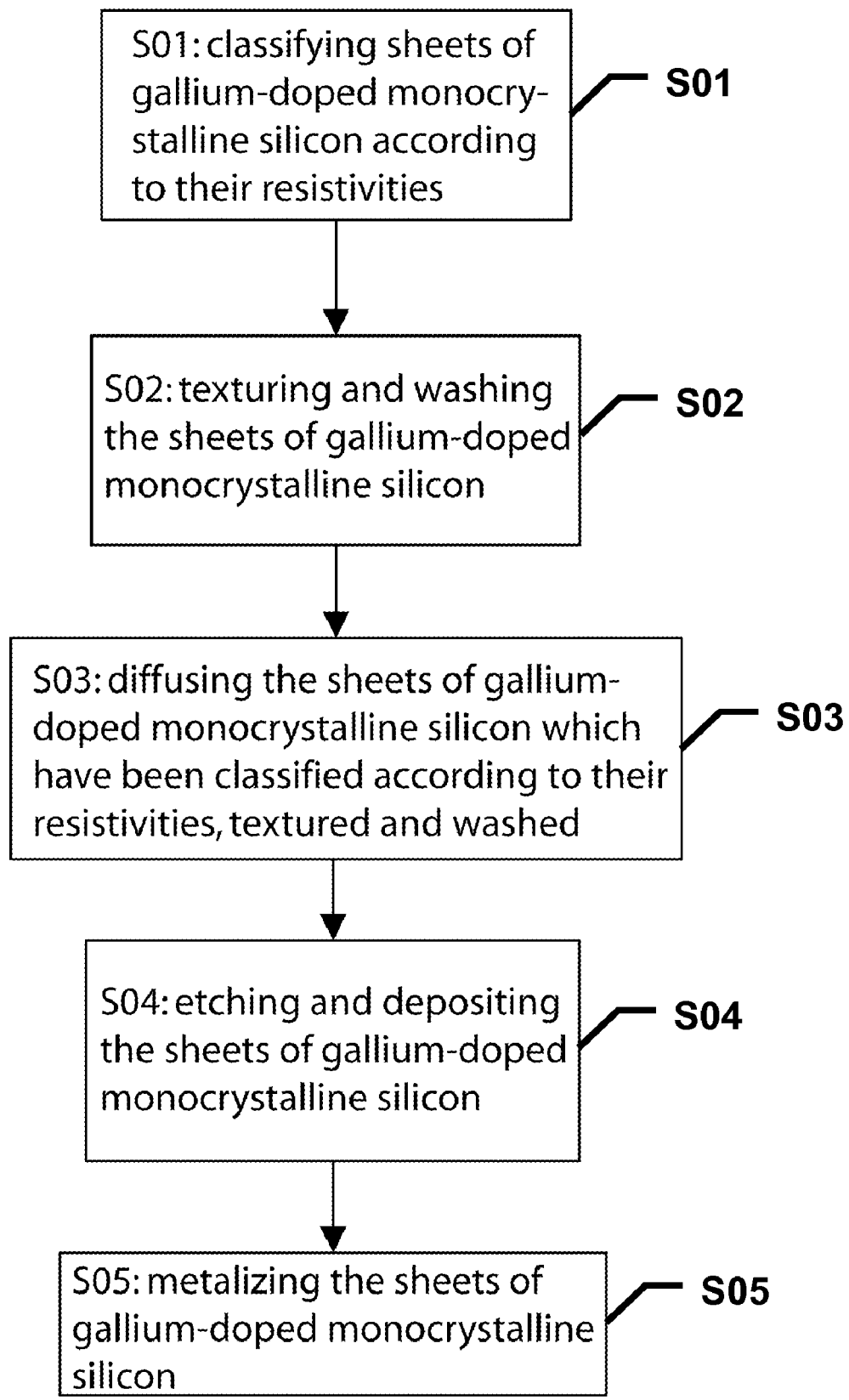

GALLIUM-DOPED MONOCRYSTALLINE SILICON SOLAR CELL AND MANUFACTURE METHOD FOR THE SAME

CROSS-REFERENCE TO RELATED APPLICATIONS

This application claims priority to foreign Patent Application CN 200810171923.8, filed on Oct. 24, 2008, the disclosure of which is incorporated herein by reference in its entirety.

FIELD OF THE INVENTION

The present invention relates to a monocrystalline silicon solar cell and a manufacture method for the same, and more particularly, to a gallium-doped monocrystalline silicon solar cell and a manufacture method for the same.

BACKGROUND OF THE INVENTION

In conventional technologies of solar energy, sheets of boron-doped monocrystalline silicon are generally used as the substrate materials for manufacturing solar cells. The doping process of such boron-doped monocrystalline silicon material is convenient and easy to be made, and the resistivity distribution of the produced monocrystalline silicon rod is uniform.

However, the cell efficiency of the solar cell, which is manufactured by using the boron-doped monocrystalline silicon, in particular the boron-doped monocrystalline silicon with low resistivity ranging from 0.5 to 1.5 $\Omega$-CM, as the substrate material, will degrade with sunlight or carriers injection. Such phenomenon is referred to as Light Induced Degradation (LID).

At present, the degradation in efficiency of the commercial boron-doped monocrystalline silicon solar cell in the market is approximately 3% to 7%. The essential reason for such characteristic of LID in cell efficiency is that, since the substitutional boron atom in the boron-doped monocrystalline silicon and the oxygen atom in the gap state in the monocrystalline silicon will form a complex of boron and oxygen with sunlight or carriers injection, wherein the complex of boron and oxygen is the deep level recombination centre, the life of a minority carriers will be reduced, and thus the diffusion length of the minority carriers will be decreased, resulting in the reduced efficiency of the solar cell. The LID will be particularly noticeable under the condition of the market shortages in the silicon materials and uneven in quality of the silicon materials.

SUMMARY OF THE INVENTION

An important aspect of the present invention advantageously resolves the relatively serious problem with LID existing in the boron-doped monocrystalline silicon solar cell materials in the prior art.

Accordingly, embodiments of the present invention provide a manufacture method in which gallium-doped monocrystalline silicon is used for manufacturing a solar cell, including classifying sheets of gallium-doped monocrystalline silicon according to resistivity, texturing and washing the sheets of gallium-doped monocrystalline silicon, diffusing the classified, textured and washed sheets of gallium-doped monocrystalline silicon, etching and depositing the diffused sheets of gallium-doped monocrystalline silicon, and metalizing the etched and deposited sheets of gallium-doped monocrystalline silicon.

Embodiments of the present invention also provide a gallium-doped monocrystalline solar cell manufactured by the above-described manufacture method. The sheet resistance of such gallium-doped monocrystalline solar cell is 40 to 45 $\Omega$/sq.

Embodiments of the present invention use the gallium-doped monocrystalline silicon as the substrate material of the solar cell. As a result, LID phenomenon of the monocrystalline silicon solar cell can be reduced or substantially suppressed, and the light induced efficiency degradation of the monocrystalline silicon solar cell can be controlled within 1%. The problem with degradation of monocrystalline silicon solar cell is thereby efficiently, economically and conveniently resolved. Meanwhile, the manufacture process of the monocrystalline solar cell is adjusted, and thus the effect of the less uniform distribution of resistivity of gallium-doped monocrystalline silicon than that of boron-doped monocrystalline silicon on the cell manufacture process is reduced.

BRIEF DESCRIPTION OF THE DRAWINGS

FIG. 1 is a schematic flowchart of a manufacture method for a gallium-doped monocrystalline silicon solar cell in accordance with an embodiment of the present invention.

DETAILED DESCRIPTION

The invention will now be described, with reference to the drawing figure.

The axial resistivity distribution of a silicon rod of gallium-doped monocrystalline silicon is less uniform than that of a boron-doped monocrystalline silicon. The relatively wider resistivity distribution of the gallium-doped monocrystalline silicon results in difficulty for manufacturing a solar cell. Accordingly, Proper adjustment and improvement are required in the manufacture process of solar cell so that the effect of the wider resistivity distribution of the gallium-doped monocrystalline silicon on initial efficiency can be reduced.

In an embodiment of the present invention, through the proper adjustment and improvement for the diffusion condition and the sintering temperature for metallization during the manufacture of the solar cell, the gallium-doped monocrystalline silicon solar cell, fabricated by using the sheets of gallium-doped monocrystalline silicon with different resistivities, may have a sheet resistance ranging from 40 to 45 $\Omega$/sq. The effect of the wider resistivity distribution of the gallium-doped monocrystalline silicon is greatly reduced, and the degradation rate of light induced efficiency of the gallium-doped monocrystalline silicon solar cell may be within 1%.

FIG. 1 is a schematic flowchart of a manufacture method for gallium-doped monocrystalline silicon solar cell in accordance with an embodiment of the present invention. As shown in the drawing, the flow comprises: a step S01 of classifying sheets of gallium-doped monocrystalline silicon according to resistivity; a step S02 of texturing and washing the sheets of gallium-doped monocrystalline silicon; a step S03 of diffusing the sheets of gallium-doped monocrystalline silicon which have been classified according to their resistivities, textured and washed; a step S04 of etching and depositing the diffused sheets of gallium-doped monocrystalline silicon; and a step S05 of metalizing the etched and deposited sheets of gallium-doped monocrystalline silicon.

In the step of S01, the sheets of gallium-doped monocrystalline silicon are classified according to resistivity after measuring the resistivity. For example, in this embodiment, the sheets of gallium-doped monocrystalline silicon are classified as sheets of gallium-doped monocrystalline silicon with resistivities greater than or equal to 0.5 Ω-cm and sheets of gallium-doped monocrystalline silicon with resistivities greater than or equal to 0.2 Ω-cm and less than 0.5 Ω-cm.

After completing the performance of texturing and washing in the step of S02, the two types of sheets of gallium-doped monocrystalline silicon with different resistivities are diffused by choosing suitable conditions of diffusion, respectively. Wherein, for the sheets of gallium-doped monocrystalline silicon with the resistivities greater than or equal to 0.5 Ω-cm, the adopted diffusion temperature is 849 to 851° C., and the diffusion time is 20 to 25 minutes; and for the sheets of gallium-doped monocrystalline silicon with the resistivities greater than or equal to 0.2 Ω-cm and less than 0.5 Ω-cm, the adopted diffusion temperature is 840 to 845° C., and the diffusion time of is 20 to 25 minutes.

Next, the general processes of etching, depositing and the like are performed for the diffused sheets of gallium-doped monocrystalline silicon through the step of S04. In step S05, the sheets of gallium-doped monocrystalline silicon are then metallized with suitable sintering temperature, which is 817 to 823° C. in the embodiment, to make their series resistances and shunt resistances normal. The sheet resistance of the sheets of gallium-doped monocrystalline silicon solar cell manufactured through the foregoing processes is 40 to 45 Ω/sq, with the conversion efficiency around 17.5%, the average LID of cell efficiency 0.7% below under one standard sunlight intensity for 4 hours, and the stable degradation of efficiency for the solar module after 4 to 5 days, and under one standard sunlight intensity for 5 to 6 hours each day, 0.5% below.

While the invention has been described hereinabove with reference to the selected preferred embodiment, it should be recognized that the invention is not limited to this precise embodiment. Rather, many modification and variations would present themselves to persons skilled in the art without departing from the scope and spirit of this invention.

What is claimed is:

1. A method for manufacturing a gallium-doped monocrystalline silicon solar cell, comprising:
    classifying sheets of gallium-doped monocrystalline silicon according to resistivity as sheets of gallium-doped monocrystalline silicon having a resistivity greater than or equal to 0.5 Ω-cm, and sheets of gallium-doped monocrystalline silicon having a resistivity greater than or equal to 0.2 Ω-cm and less than 0.5 Ω-cm;
    texturing and washing the sheets of gallium-doped monocrystalline silicon;
    diffusing the classified, textured and washed sheets of gallium-doped monocrystalline silicon for 20 to 25 minutes at a diffusion temperature;
    etching and depositing the diffused sheets of gallium-doped monocrystalline silicon; and
    metalizing the etched and deposited sheets of gallium-doped monocrystalline silicon,
    wherein, when the resistivity of the gallium-doped monocrystalline silicon sheet is greater than or equal to 0.5 Ω-cm, the diffusion temperature is 849 to 851° C., and, when the resistivity of the gallium-doped monocrystalline silicon sheet is greater than or equal to 0.2 Ω-cm and less than 0.5 Ω-cm, the diffusion temperature is 840 to 845° C.

2. The method according to claim 1, wherein the metalizing step includes an adopted sintering temperature of 817 to 823° C.

3. A gallium-doped monocrystalline solar cell manufactured according to the method of claim 1.

4. The solar cell according to claim 3, wherein the sheet resistance of the solar cell is 40 to 45 Ω/sq.

* * * * *